APPARATUS FOR ELECTROCHEMICAL ETCHING

Filed Oct. 27, 1959 4 Sheets-Sheet 1

INVENTOR.
Harry da Costa
BY
Mueller & Aichele
Attys.

April 23, 1963 H. DA COSTA 3,086,936

APPARATUS FOR ELECTROCHEMICAL ETCHING

Filed Oct. 27, 1959 4 Sheets-Sheet 2

INVENTOR.
Harry da Costa
BY
Mueller & Aichele
Att'ys

April 23, 1963 H. DA COSTA 3,086,936

APPARATUS FOR ELECTROCHEMICAL ETCHING

Filed Oct. 27, 1959 4 Sheets-Sheet 3

INVENTOR.
Harry da Costa
BY
Mueller & Aichele
Attys

APPARATUS FOR ELECTROCHEMICAL ETCHING

Filed Oct. 27, 1959 4 Sheets-Sheet 4

INVENTOR.
Harry da Costa
BY
Mueller & Aichele
Attys.

3,086,936
Patented Apr. 23, 1963

3,086,936

APPARATUS FOR ELECTROCHEMICAL ETCHING

Harry da Costa, Phoenix, Ariz., assignor to Motorola, Inc., Chicago, Ill., a corporation of Illinois Filed Oct. 27, 1959, Ser. No. 849,053
10 Claims. (Cl. 204—224)

This invention relates generally to apparatus and a method for moving a tool to an exact position closely spaced from a workpiece of miniature or microminiature size. The invention will be specifically described and illustrated in connection with the etching of a desired configuration in semiconductor bodies for high frequency transistors, wherein an etching head must be positioned one ten-thousandths of an inch away from the surface of the semiconductor body which is to be etched.

Although the utility of the invention is not limited to the manufacture of high frequency transistor devices, it has been applied in this field with several very beneficial results, such as an increase in the speed of fabricating the transistors thereby increasing the output of the manufacturing facility, and also an increase in the yield of commercially acceptable units in a given quantity of the output. The reasons behind these advances can best be understood by considering some of the practical difficulties involved in mass production of a particular high frequency transistor.

This transistor has a semiconductor die or wafer approximately eighteen-thousandths of an inch square by three-thousandths of an inch thick, which is mounted on a carrier known as a header. The semiconductor body has a rectangular central area with dimensions of approximately three-thousandths of an inch by four-thousandths of an inch which defines the active base region and collector junction of the transistor. This area is as small as the cross-sectional area of an average human hair. Emitter and base electrodes approximately one thousandths of an inch by two-thousandths of an inch are located on this central region, and the main portion of the semiconductor wafer adjoining the central region serves as the collector of the transistor. In the manufacturing operation, semiconductor material is etched away from the area of the wafer surrounding the central region so that the central region, which is unetched, projects from the etched area much like a mesa. Because of this appearance these transistor units are called "mesa" transistors.

A special electro-pneumatic-hydraulic etching head has been provided which is capable of accomplishing the etching just described by directing a hollow stream of etching liquid onto the surface to be etched, and the central region of the surface which must be left unetched is masked by gas which flows through the center of the etching stream. The etching head and method of etching just referred to is the joint invention of Harry da Costa and C. H. Knowles as described and claimed in a copending application Serial No. 10,395, filed on February 23, 1960, and assigned to the present assignee. With this etching head, it is not necessary to apply wax or other resist material to the central region of the semiconductor body in order to mask it, because the masking function is accomplished by the gas. By avoiding the use of resist material on the semiconductor body, a source of contamination, which may seriously impair the performance of the transistor and even render it unacceptable, is eliminated.

In order to employ such an etching head successfully, it must be positioned over the target area very accurately, and the distance at which the etching head is held from the surface to be etched is particularly critical. It has been found that a suitable spacing between the semiconductor surface and the end of the etching head is of the order of one ten-thousandths of an inch, which is approximately one-thirtieth the diameter of an average human hair. However, the nominal height of the semiconductor surface varies several thousandths of an inch plus or minus between different transistor units because of unavoidable manufacturing tolerances. It is clear from this that merely lowering the etching head to a specific point above the surface to be etched would result in variations in the actual spacing between the etching device and the surface to be etched that would be the equivalent of the manufacturing tolerances of the transistor. Such variations would make it practically impossible to control the dimensions of the unetched central region with the required accuracy.

Prior art apparatus for positioning a workpiece relative to a tool has proved to be impractical for the purposes described above. With such apparatus it is necessary to measure the height of each workpiece with an instrument such as a micrometer, and then adjust a micrometer elevating control on the etching machine by an amount calculated to leave the required spacing between the workpiece and the etching head in the lowered position. This procedure has to be followed with each workpiece to be etched, and is so awkward and lengthy that it would be difficult to achieve satisfactory production rates. Furthermore, the known apparatus is not completely reliable, and the reliability depends a great deal on the skill and attentiveness of the operator. The operator is likely to tire rapidly, and this will decrease the output of a given machine. All of this tends to make the manufacturing operation inefficient and uneconomical.

It is an object of the present invention to provide a method and apparatus for accurately positioning an etching head with respect to a surface on a workpiece so that an area of particular configuration and microminiature dimensions can be etched on the surface by applying etching fluid or electrolyte to the area through the etching head.

Another object of the invention is to provide apparatus for automatically measuring the exact height of workpieces which vary in height, and which automatically moves an etching head to a position determined by the specific height of the workpiece being etched, so that the etching head is spaced accurately a predetermined distance away from the workpiece.

A further object of the invention is to provide an etching machine with apparatus which will quickly and accurately align the etching head with a specific target on the surface to be etched, and with automatic spacing apparatus which will move the etching head to a position spaced a predetermined distance away from the target.

Another object of the inventioh is to provide apparatus which utilizes the etching head of the aforementioned copending application Serial No. 10,395 for etching a moat around an unetched central area of a semiconductor body in the fabrication of high frequency transistors, and which will reliably produce the etched and unetched areas in exactly the right places and with proper dimensions so that high yields of commercially acceptable devices are obtained.

A feature of the invention is the provision of a method and apparatus for positioning an etching head a predetermined distance away from a workpiece to be etched, in which the workpiece is supported in a given position, the etching head is moved from a rest position into contact with a specific area of the surface on the workpiece which is to be etched, and the etching head is then moved directly away from the surface the exact distance required for etching an area of desired shape and dimensions.

Another feature of the invention is the provision of an etching machine having a movable plate which can be positioned very accurately by manipulating a pantograph lever system, and having an etching head, together with an automatic mechanism for raising and lowering the head, mounted on the movable plate so that the head can be aligned accurately with a workpiece by manually controlling the pantograph lever and is then moved to the exact position required for etching by the automatic mechanism.

Another feature of the invention is the provision of an etching machine in which an etching head is mounted on a pivotal structure, and in which the height of the workpiece to be etched is automatically measured by a rotary cam which actuates the pivotal structure and moves the etching head into contact with the workpiece. A spacing mechanism is provided which automatically lifts the etching head off of the workpiece and moves it a predetermined distance away, such that the desired spacing between the head and the workpiece is accomplished quickly and accurately with a machine having a simple and economical construction.

An embodiment of the invention is illustrated in the accompanying drawings in which.

Figures 1, 2:
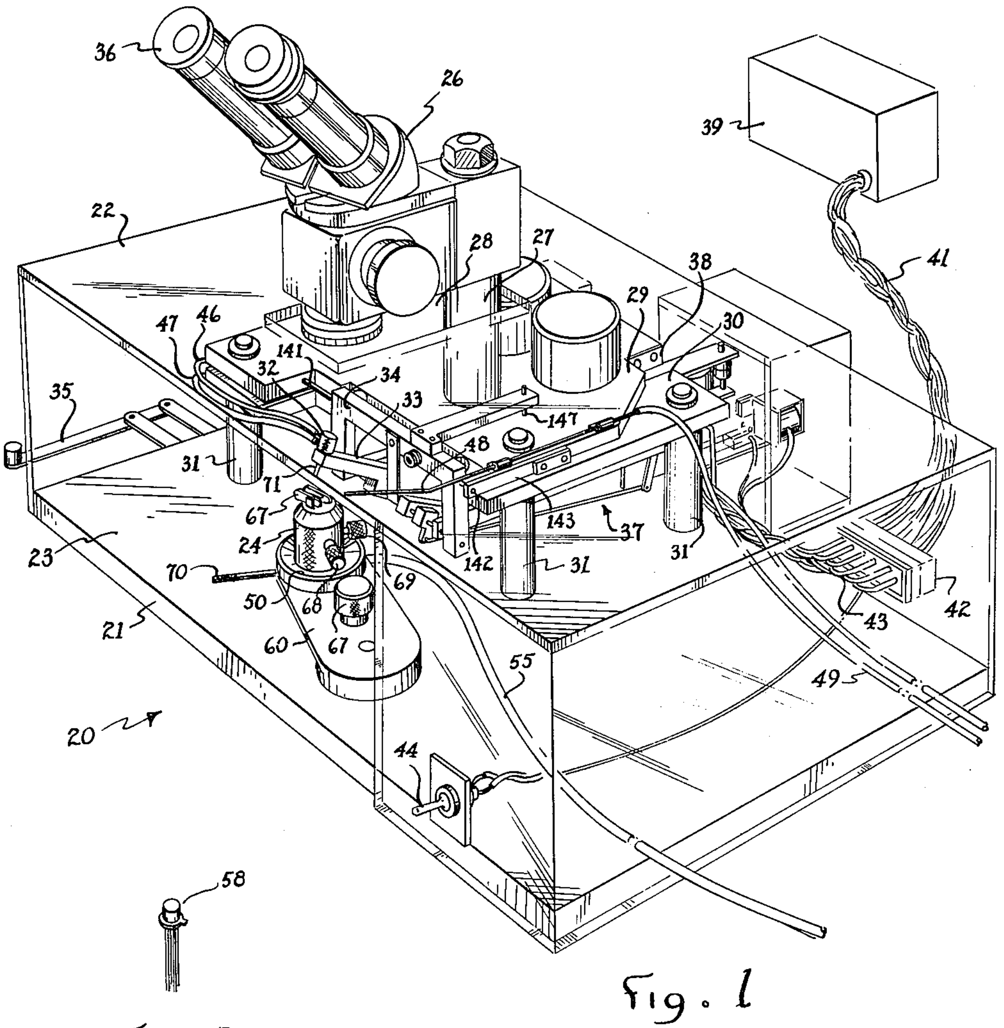
FIG. 1 is a perspective view of a complete etching machine in accordance with the invention.
FIG. 2 shows the actual size of a high frequency transistor which is the end product of the manufacturing process in which the machine of FIG. 1 is employed.

It is apparent that a great deal of precision is required to position an etching head directly over a target area which will fit on the end of a human hair, and then further position the etching head so that the end of it is held less than a hair's width away from the target area. This is the precision that is required of the apparatus of the invention, and yet the apparatus accomplishes this quickly and reliably with minimum demands on the operator. As previously mentioned, the positioning of the etching head is complicated by the fact that the specific height of the surface to be etched will vary by an amount equivalent to the dimensional tolerances of the workpieces being etched, and where the workpiece is a subassembly for transistor devices as described herein, these tolerances are considerably greater than the required spacing between the semiconductor surface and the etching needle. In the machine of the invention variations in the height of the surface to be etched are automatically taken into account by automatic apparatus which lowers the etching head into contact with the surface to be etched, and then raises the etching head the exact distance required to produce the desired spacing.

This automatic apparatus includes a pivotal carrier arm on which the etching head is mounted, and another pivotal arm for controlling the movement of the carrier arm. The arms are driven by a cam which is rotated by a motor, and the arms are coupled together and move simultaneously as the head is lowered into contact with the surface to be etched. When the head is resting on the surface, the carrier arm is stationary, but the control arm moves independently just enough to actuate a switch which stops the driving motor and the rotary cam. The control arm is coupled to the rotary cam by a spacing mechanism which includes a movable armature actuated by an electromagnet. The electromagnet is energized at the proper time causing the armature to move a preadjusted distance, and this causes the control arm to engage the carrier arm and move it just enough to lift the etching head off the surface to be etched the exact distance which is required for proper etching.

In order to have the etching head contact the semiconductor surface at the exact place where the etching must be done, it is necessary to aim the head very accurately. This aiming function is accomplished by a micromanipulator which is described and claimed in another copending application of the present inventor, Serial No. 794,391, filed February 19, 1959. Since the micromanipulator structure of that application is utilized in the illustrated embodiment of the present invention, it will be described and illustrated briefly herein. The micromanipulator includes a pair of superposed plates supported horizontally over a base. The lower plate is stationary and serves as a support for the upper plate, and bearings are provided between the plates so that the upper plate is movable in any horizontal direction. The movement of the upper or positioning plate is controlled by a pantograph mechanism which is coupled to the positioning plate by rotary cams. A microscope having a target finder such as crosshairs is mounted on the movable positioning plate at a place where the operator can look through the microscope and view the surface on the semiconductor wafer which is to be etched. The pivotal arms for lowering and spacing the etching head are coupled to the positioning plate in a manner such that the vertical movement of the head is parallel to the optical axis of a lens system of the microscope, and the relationship between the etching head and the microscope is adjusted such that the head will contact the semiconductor wafer at the exact place on which the crosshairs of the microscope are sighted. Thus, in order to aim the etching head it is only necessary for the operator to manipulate the pantograph mechanism to bring the crosshairs of the microscope into exact alignment with the surface which is to be etched, and this can be accomplished very quickly and easily. The operator then operates a switch to actuate the automatic positioning apparatus which lowers and spaces the etching head, and the rest of the etching operation takes place automatically.

The description of the illustrated embodiment of the invention will be broken down into four main sections in order to provide a clear understanding of the various mechanical structures and electrical circuits which are involved. The first section will be a general description of the complete etching machine primarily in connection with FIG. 1, and is intended to point out the basic nature and construction of the machine. The second section will be directed to the transistor subassemblies including a semiconductor wafer which are etched by the machine and the manner in which the etching takes place, with particular reference to FIGS. 2 to 6 inclusive. The third section will cover the automatic apparatus which controls the spacing of the etching head from the surface to be etched, and the fourth section will cover the micromanipulator apparatus which positions the etching head directly over the target area so that when it is lowered it will come into contact with the exact area which is to be etched.

*The Complete Etching Machine*

Figure 3:
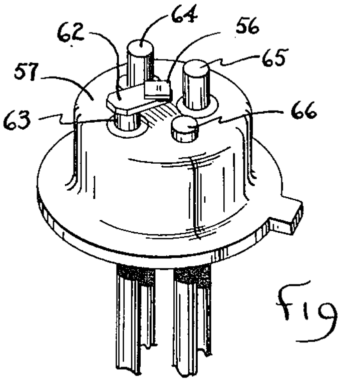
FIG. 3 is an enlarged view of a header assembly for the transistor unit of FIG. 2 showing particularly the condition of the assembly at the stage of the manufacturing process where it is supplied to the machine of FIG. 1 for etching.

The etching machine 20, as illustrated in FIG. 1, is supported on a base plate 21, and is partially enclosed by a transparent casing 22 which protects the machine from dust, dirt and other foreign matter. There is an opening 23 at the front of the casing 22 through which the operator inserts the header assemblies which are to be etched and removes the units after etching. A typical header assembly 57 is shown in FIG. 3 which is enlarged to show the construction of the assembly. The operator faces the opening 23, so this side of the machine will be referred to as the front for reference purposes, and the movements of the various parts will be referred to as left, right, forward, backward, up and down with respect to the front of the machine.

The header assemblies (FIG. 3) are mounted on a leveling device 24 (FIG. 1) in a manner which will be described more fully in the second section. The leveling device itself is described and claimed in a copending application Serial No. 10,439, filed on February 23, 1960. The operator of the machine views the area of the semiconductor body 56 mounted on the header through a binocular microscope 26 which is mounted on an upright post 27 that extends through an opening 28 in the top of the casing 22. The post 27 is secured at its base to a horizontal positioning plate 29 which is movably supported on a mounting plate 30. The mounting plate 30 is in turn supported rigidly by a number of upright posts 31 which are secured at their bases to the base plate 21. An etching head 32 having an etching needle 71 is carried on an arm 33 which is pivotally connected to a frame 34. The frame 34 is coupled to the positioning plate 29, so horizontal movement of the positioning plate 29 provides horizontal movement of the etching head 32. These horizontal movements are controlled by manipulation of the pantograph lever system 35 which is coupled to the positioning plate 29 by a spindle and cam arrangement that will be fully described in the fourth section in connection with FIGS. 10–12.

The microscope 26 has crosshairs in the tube 36 to facilitate aiming of the etching head 32 so that when it is lowered into contact with the surface to be etched it will engage this surface at exactly the right place. The operator aims the etching head 32 by lining up the crosshairs of the microscope with the target area, and the operator does this by moving the pantograph lever system 35 forward, backward, left or right as necessary until the crosshairs and the target area viewed through the microscope are brought into exact alignment. Once the crosshairs have been lined up with the target area in this manner, the etching head 32 is accurately aimed and will consistently engage the workpiece at the right place when the arm 33 is lowered.

Figures 5, 6, 7, 8:
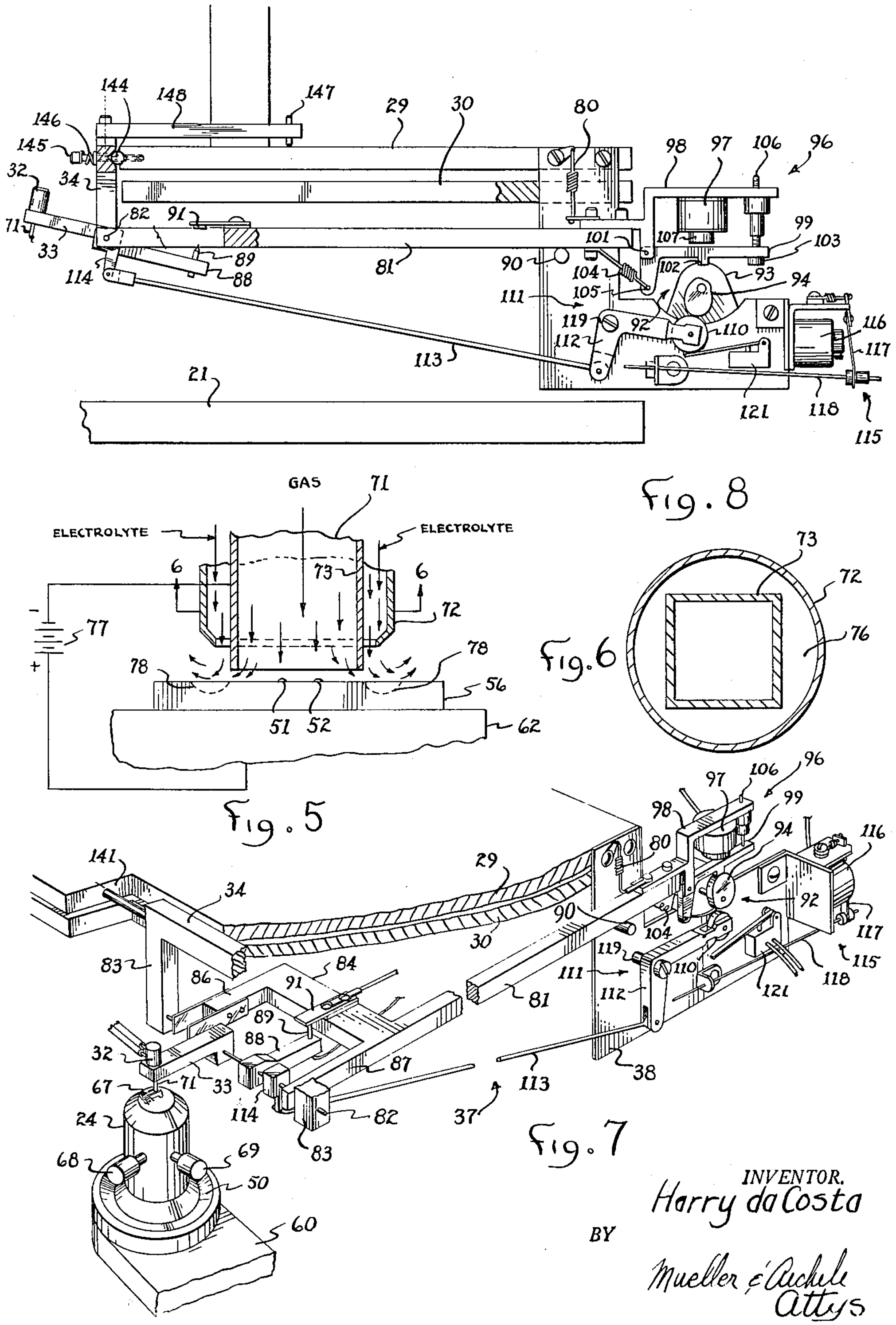
FIG. 5 is a longitudinal section of part of an etching needle employed in the apparatus of FIG. 1 showing in particular its relation to the semiconductor unit of FIG. 4 at the time the etching takes place.
FIG. 6 is a cross-sectional view of the etching needle taken along line 6—6 of FIG. 5.
FIG. 7 is a perspective view of certain automatic apparatus included in the machine of FIG. 1 which controls the spacing of the etching head with respect to the semiconductor body of FIG. 4 so as to produce the desired etching action.
FIG. 8 is an elevational view of the apparatus of FIG. 7 which further illustrates its construction.

Lowering and raising of the arm 33 is controlled by an automatic positioning mechanism 37 which is only partly visible in FIG. 1, but which is illustrated clearly in FIGS. 7 and 8. The positioning mechanism 37 is supported by the frame 34 and also by another frame 38 which can be seen best in FIGS. 7 and 8. Both the frame 34 and the frame 38 are attached to the positioning plate 29, and thus the entire positioning mechanism 37 moves when plate 29 is moved for purposes of aiming the etching head 32. The operation of the positioning mechanism 37 is controlled by a timing mechanism 39 provided in a separate enclosure as shown in FIG. 1. Several electrical connectors 41 leading from the timing mechanism 39 are plugged into a terminal block 42 mounted on the back of the case 22, and other electrical connectors 43 leading to the positioning mechanism 37 are likewise plugged into the terminal box 42. The operation of the positioning mechanism 37 is started by actuating a switch 44 mounted on the front of the case 22, and the etching is carried out entirely automatically after the switch 44 is actuated. Etching liquid and gas are supplied to the etching head 32 through plastic tubes 46 and 47, and rinse water is supplied by a hose 49 to a pipe 48 which directs the water on the etched surface. The overflow etching liquid and water runs down over the leveling device 24 into a pan 50 on which the device 24 sits, and these fluids are drained by another hose 55. The pan 50 is supported on a platform 60 which is adjusted by the controls 67 and 70.

*Mounting and Etching of the Workpiece*

In the illustrated embodiment of the invention, the workpiece is a very tiny wafer of germanium 56 which is mounted on a header assembly 57 as shown in an enlarged view in FIG. 3. When the transistor unit is complete, it is provided with a cover which fits over the header 57, and such a complete unit 58 is shown in actual size in FIG. 2. From FIG. 2 it can be seen that the main body of the transistor 58 is no larger than the eraser of an ordinary lead pencil. However, the area which is actually etched is much smaller than this, and it is necessary to enlarge the wafer 56 many times as has been done in FIG. 4 in order to show the channel or moat 59 which is formed by the etching. The moat 59 surrounds a central unetched area 61 which is called a mesa, and a pair of tiny electrodes or stripes 51 and 52 are located on the mesa 61. The electrodes 51 and 52 are formed by vapor deposition of metals during a stage in the processing of the transistor prior to the etching, and the wafer 56 having the electrodes 51 and 52 on it is mounted on the header 57 prior to the etching. The wafer 56 is supported on a heat sink tab 62 which is fastened to the upper end of a lead 63 which serves as the collector lead of the transistor. The other leads 64, 65 and 66 are respectively the base, emitter and ground leads of the transistor. The completed transistor has tiny contact wires extending from leads 64 and 65 to the electrodes 51 and 52, but these are not shown in FIG. 3 since the assembly 57 is illustrated in its condition just prior to etching.

The header assembly 57 fits into a recess in the top of the leveling device 24 and is held in place by a small clip 67. Before the leveling device 24 is put in place on the pan 51, it is necessary to adjust a pair of micrometer knobs 68 and 69 on the device so that the upper surface of the wafer 56 will be exactly parallel to the end of the needle through which the etching fluid is applied to the wafer. The proper relationship between the wafer 56 and the needle 71 of the etching head is illustrated in FIG. 5.

The needle 71 has an outer tube 72 and an inner tube 73. The etching fluid flows through the space between tubes 72 and 73, and gas flows through the center of tube 73. The end of the needle 71 is positioned one ten-thousandths of an inch away from the upper surface of the wafer 56, and with this spacing the gas flows outwardly from the bottom of tube 73 and forces the etching fluid outwardly causing it to etch a moat of exactly the desired shape and dimensions. If the tube 73 is not properly spaced with respect to the upper surface of wafer 56, or if the end of tube 73 and the upper surface of wafer 56 are not precisely parallel, the moat will vary from the desired shape and dimensions.

In order to determine when the wafer 56 has been properly leveled, the leveling device 24 is placed under a separate microscope provided with a light reflecting system (not shown). By looking through the microscope the operator can see two separate crosshairs, and these crosshairs can be aligned by turning the knobs 68 and 69. When the crosshairs are aligned, the wafer 56 is properly leveled. This optical system is not shown herein since its construction is not essential to a full understanding of the present invention.

Figure 4:
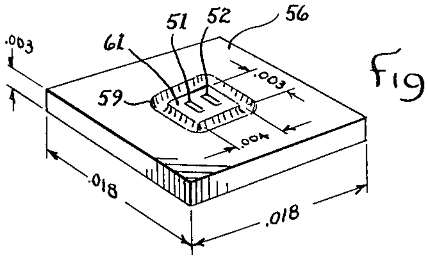
FIG. 4 is a greatly enlarged perspective view of the semiconductor unit included in the transistor of FIGS. 2 and 3 and shows in particular the configuration and dimensions of the etched and unetched areas that are formed by the machine of FIG. 1.

FIGS. 5 and 6 considered together with FIG. 4 give an idea of the precision required in aligning the etching needle 71 with the wafer 56 and in spacing the end of the needle 71 one ten-thousandths of an inch away from the wafer 56. The inner tube 73 of the needle 71 through which the obturating gas flows has about the same area as the area desired for the unetched central region or mesa to be formed on the wafer 56. The tube 73 is rectangular since a generally rectangular configuration is desirable for the mesa. The outer tube 72 of the needle 71 has a circular cross section and a somewhat larger diameter than tube 73 so that a passage 76 is provided between the needles. The electrolyte flows through this passage and is directed towards the surface of the wafer 56 as illustrated in FIG. 5. Electrical potential supplied from a suitable source, as indicated by the battery 77 in FIG. 5, is applied to the needle 71 and to the wafer 56, and the polarity of this potential is selected so that the needle is negative with respect to the wafer 56. This potential causes the material of the wafer that is contacted by the electrolyte to be etched away as indicated by the dotted lines 78 in FIG. 5. The distribution of current in the stream of electrolyte is such that the material is only etched away from the area 78. The gas flowing down through the tube 73 is at a slightly higher pressure than the surrounding atmosphere and therefore flows outwardly around the lower end of the tube 73 and forces the electrolyte to flow outwardly away from the tube 73. The result is that the electrolyte etches a moat 59 having the configuration illustrated in FIG. 4.

It is apparent that the needle 71 must be aligned with the electrodes 51 and 52 in order for the electrodes to be located at the center of the moat. Considering the fact that the mesa formed by the etching has dimensions of only three mils by four mils, it is apparent that the alignment and spacing of the needle 71 must be extremely accurate.

If the upper surface of the wafer 56 were tilted with respect to the end of the tube 73, the gas would not flow uniformly around the end of the tube, and this would cause the configuration of the moat to be distorted. The gas pressure at the end of the tube 73 is influenced by the spacing of the needle with respect to wafer 56, and this gas pressure controls the flow of electrolyte. If the needle is too far away from the wafer 56, the pressure at the end of tube 73 will be decreased and the electrolyte will tend to flow toward the center of tube 73 and reduce the area of the unetched mesa. Conversely, if the needle is too close to the wafer 56, the gas pressure at the end of tube 73 will be too high and the etching fluid will be blown outwardly too fast for proper etching action.

*Vertical Positioning of the Etching Head*

The structure and circuits for vertical positioning of the etching head with respect to the wafer 56 and for controlling the gas and liquid flows through the etching head will be described primarily with reference to FIGS. 1, 7 and 8. Only part of the complete etching machine is shown in FIGS. 7 and 8 since this will provide a clear picture of the vertical positioning structure. As may be seen best in FIGS. 7 and 8, the etching head 32 and the vertical positioning mechanism 37 are supported by the frames 34 and 38 which are attached to the positioning plate 29 of a micromanipulator.

The front frame 34 is pivoted about an axis through the spindles 141 and 142 and is also adjustable along this axis. Viewing the apparatus as in FIGS. 1, 7, 10 and 12, frame 34 can be adjusted to the left and right with respect to the plate 29 by turning an adjusting screw 142, which provides one of the spindles, and which is threaded through an aperture in a holder 143 fastened to the plate 29. The other spindle 141 is a spring plunger which biases the frame 34 to the right against the adjusting screw 142, so that the frame 34 follows the longitudinal movement of the screw 142. There are two rollers 144 (see FIG. 12 and also FIG. 8) which fit into opposed V-shaped grooves in the frame 34 and the positioning plate 29, and these rollers permit the pivotal movement and the left-right adjustment of the frame 34. A screw 145 (FIGS. 8, 10 and 12) extends through an enlarged opening in the frame 34 and is threaded into the positioning plate 29, and a strong spring 146 extending between a washer on the head of the screw 145 and the frame 34 biases the frame against the plate 29. Pivotal adjustment of the frame 34 is accomplished by turning the screw 147 which is threaded through an arm 148 connected to the frame 34. Pivotal movement of the frame 34 moves the etching needle 71 forward or backward as required. The left-right and forward-backward adjustments provided respectively by the adjusting screws 142 and 147 are employed in aligning the etching head with the crosshairs of the microscope so that the etching head will contact the workpiece at exactly the place where the crosshairs are sighted on the workpiece. The alignment is such that the arm 33 moves along and parallel to the optical axis of the lens system associated with tube 36 of the microscope, and thus the alignment is not dependent on the focus of the microscope.

Once the etching head has been aligned with the crosshairs of the microscope in this manner, the aiming of the etching head so that it will contact a workpiece at the desired place is a simple and fast process. The operator merely looks through the microscope and adjusts the lever 35 until the crosshairs are aimed at the target area, and the etching head is then properly lined up with the surface to be etched.

Figures 10, 11, 12:
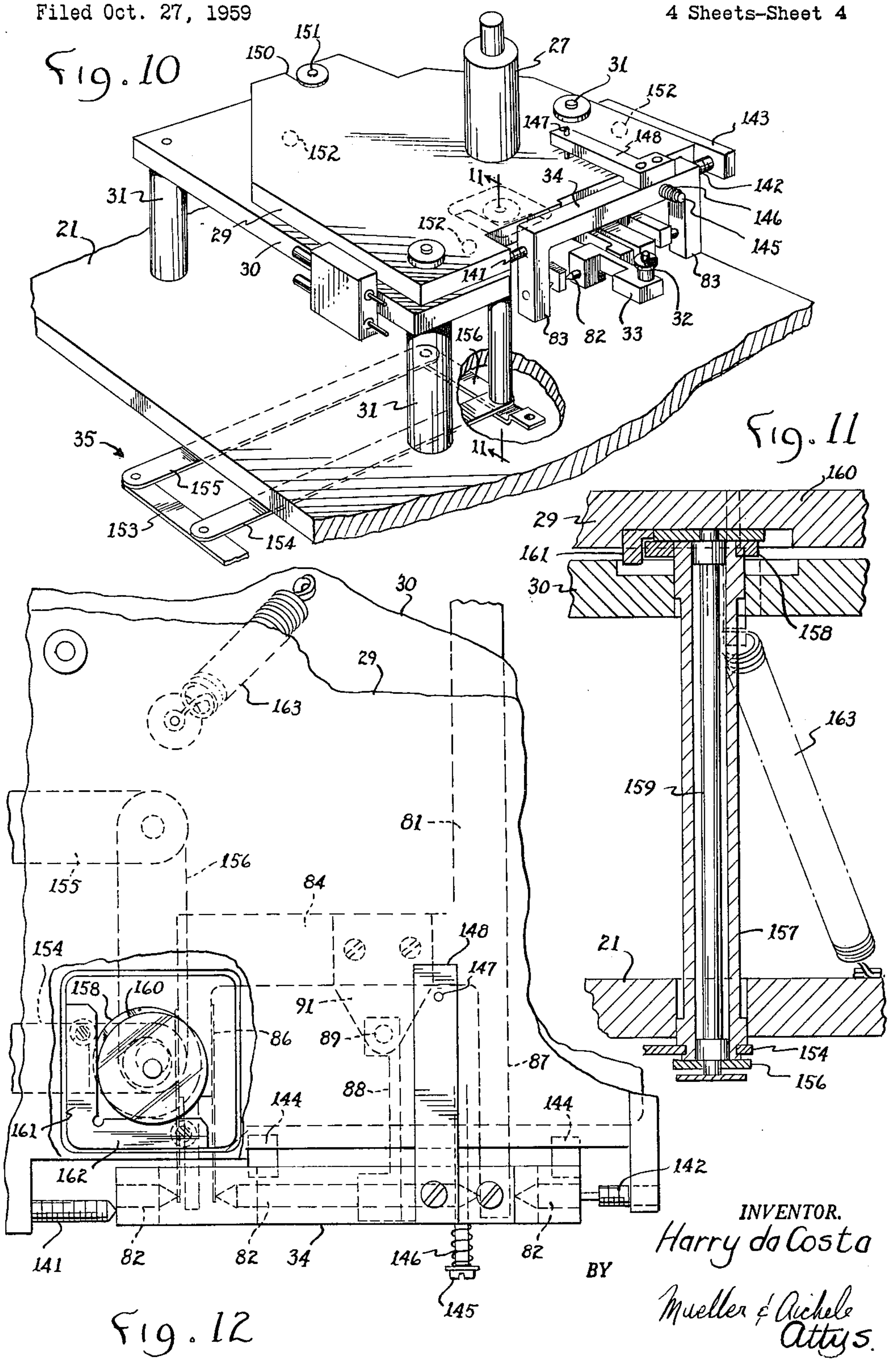
FIG. 10 is a perspective view showing the basic construction of a micromanipulator apparatus included in the machine of FIG. 1.
FIG. 11 is a longitudinal section taken along line 11—11 of FIG. 10 showing the construction of a spindle and cam assembly provided in the micromanipulator apparatus.
FIG. 12 is a fragmentary plan view of part of the apparatus of FIG. 10 with portions cut away to reveal the cams shown also in FIG. 11.

The etching head is lowered automatically by the positioning apparatus 37 under the control of the timer 39. Referring to FIGS. 1, 7 and 8 it may be seen that the positioning mechanism 37 includes the carrier arm 33 on which the etching head 32 is mounted, and a control arm 81 which extends under the plates 29 and 30 of the micromanipulator and normally rests on stop pin 90. A tension spring 80 is provided to partially compensate for the overhang weight of arm 81, thus relieving some of the arm weight from the cam 94 in operation. Both the carrier arm 33 and the control arm 81 are pivotally movable about the axis of a spindle 82 which extends between the two vertical legs 83 of the frame 34. Actually, the spindle 82 has separate parts which permit independent pivotal movement of the arms 81 and 33, as shown in FIG. 12.

Figure 9:
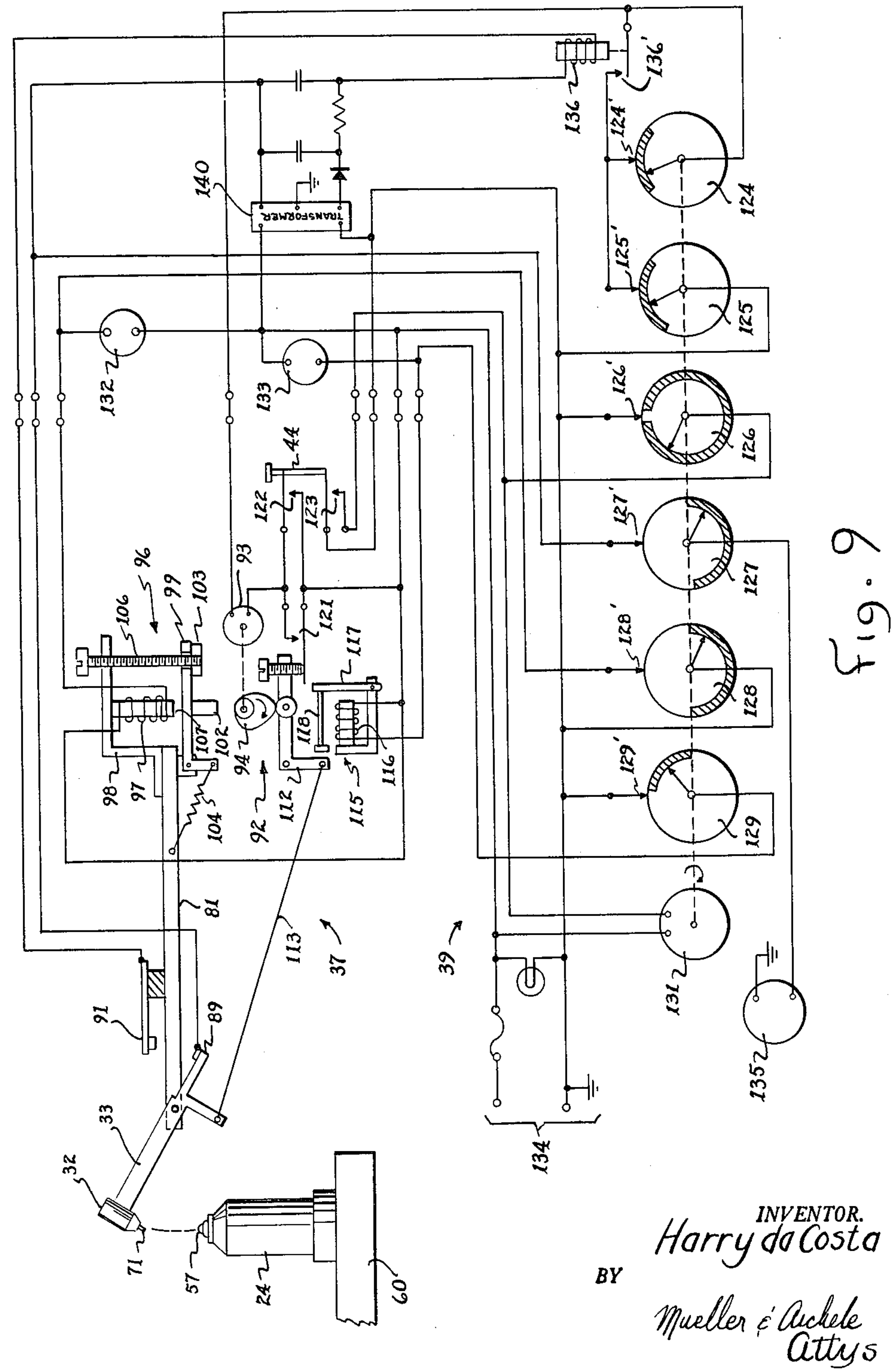
FIG. 9 is a schematic diagram illustrating in particular the control circuits and mechanisms which provide automatic operation of the apparatus of FIGS. 7 and 8.

The arm 81 has two legs 86 and 87 which are joined together by a transverse leg 84. The carrier arm 33 has an extension 88 that is connected to the spindle 82 and extends rearwardly toward the transverse leg 84 of the control arm 81. The extension 88 may be a separate piece as illustrated in FIG. 7, but the arm 33 and the extension 88 are fastened together by the spindle 82 and they move together. The extension 88 has a contactor 89 which is engageable by another contactor 91 mounted on the leg 84 of the control arm 81 but electrically insulated therefrom. Electrical connections are made to these contactors as illustrated in FIG. 9. When the contactors 89 and 91 are in engagement, the carrier arm 33 can be pivoted upwardly by depressing the control arm 81 since the contactors couple the two arms together. However, if either of the arms 33 and 81 is pivoted upwardly, the contactors 89 and 91 disengage and the arms are independently movable. Thus, the contactors 89 and 91 serve a mechanical coupling function as well as an electrical function.

The two arms 33 and 81 are moved by a driving mechanism 92 mounted on the rear frame 38. The driving mechanism 92 includes a motor 93 (see FIG. 8), and a rotary cam 94 which is rotated by the motor. The cam 94 is coupled to the control arm 81 by a spacing mechanism 96 mounted on the rear end of the arm 81. The spacing mechanism 96 includes an electromagnet 97 mounted on a bracket 98 which is fastened to the arm 81, and also includes an armature 99 which is pivotally connected to the bracket 98 at a pivot point 101. As the cam 94 rotates, it engages a lug portion 102 on the armature 99 and thereafter further rotation of the cam 94 pivots the control arm 81 upwardly. The free end of the armature 99 is biased against a stop 103 by a spring 104 connected between the arm 81 and a downward extension 105 of the armature 99. The stop 103 is adjusted by rotating a screw 106 threaded through the bracket 98. When the electromagnet 97 is energized, it pulls the armature 99 away from the stop 103 and into contact with another stop 107. This short movement of the armature 99 causes a slight downward movement of the control arm 81, and it is this downward movement of the control arm that properly spaces the etching head 32 away from the wafer 56 as will be explained further.

The rotary cam 94 is coupled to the carrier arm by a mechanism 111 which includes a bell crank 112 and a connecting rod 113. A roller 110 on the crank 112 engages the cam 94. The rod 113 is connected to a downward extension 114 of the carrier arm 33, and this extension 114 may be a separate piece which is rigidly secured to the main body of arm 33 by the spindle 82, as illustrated in FIG. 7. Thus, longitudinal movement of the connecting rod 113 causes the arm 33 to pivot vertically. The carrier arm 33 can be raised vertically independent of the cam 94 by a lifting mechanism 115 which includes an electromagnet 116 having an armature 117 connected to an actuator 118. When the electromagnet 116 is energized, the armature 117 is pulled toward the electromagnet, and the actuator 118 is forced against the downwardly extending arm of the crank 112. The crank 112 is pivotal about a point 119, so the pressure of the actuator 118 pivots the arm 112 clockwise moving the rod 113 to the left as viewed in FIG. 8, thus raising the carrier arm 33 and the etching head 32. The lifting mechanism 115 is actuated at the end of the etching cycle in order to move the etching head 32 away from the wafer 56 without recontacting the surface of the wafer 56. The crank 112 also controls a switch 121 whose function will be explained in connection with the description of the etching cycle.

The etching cycle will be described with reference to FIG. 9. At the beginning of the cycle, the etching head 32 is held in a raised rest position by the carrier arm 33. The contactors 89 and 91 are separated, so the arms 33 and 81 are free to move independently. The rotary cam 94 is at a starting position as illustrated in FIGS. 8 and 9, and the drive motor 93 for the cam is deenergized. The timing mechanism 39 is also in a starting position with the six rotary cam switches numbered 124–129 inclusive in the positions illustrated in FIG. 9. The driving motor 131 is initially off, and the valves 132 and 133 which respectively control the flow of the etchant and distilled water are closed. Alternating current for driving the motors 93 and 131 is supplied from a power source connected to the terminals 134, and etching current is supplied to the etching head from a direct current power source 135. When the momentary contact starting switch 44 is actuated by the operator, contacts 122 close and complete an energizing circuit for the cam drive motor 93, and contacts 123 close and complete an energizing circuit for the timing motor 131. The drive cam 94 and the timing cams 124–129 then start to rotate in a clockwise direction as illustrated in FIG. 9. The crank 112 is biased against the cam 94 by the weight of the carrier arm 33 applied by the connecting rod 113, and thus the crank 112 pivots counter clockwise during the initial rotation of the cam 94. Thus, the connecting rod 113 moves generally to the right as viewed in FIG. 9, and the carrier arm 33 together with the etching head 32 are lowered. The crank 112 also actuates the switch 121, and this switch parallels the manual contacts 122 so that the motor 93 will remain energized after the momentary contact switch 44 is released. The timing cam 126 parallels the contacts 123 of switch 44, and the associated contact 126′ is closed immediately after the timing cams start rotating to keep the timing motor 131 energized throughout one complete rotation of the timing cams. The shaded areas around the periphery of the timing cams represent that portion of the rotation of the cams during which the associated contacts are closed.

As previously mentioned, the etching head 32 is descending during the first portion of the etching cycle, and when the cam 94 has completed about one-quarter of a revolution the contactors 89 and 91 are engaged. This completes an alternating current energizing circuit from terminals 34 through the transformer 140 to the relay 136 causing the relay to operate. Relay 136 closes the associated contacts 136′ which bypass the contacts 124′ of the timing cam 124. As the cam 94 continues to roate, it becomes disengaged from crank 112 and engages the lug 102 on the armature 99 of the spacing mechanism 96. The cam 94 raises the control arm 81. Carrier arm 33, now coupled to arm 81, is lowered slowly, and the etching head 32 continues its descent until the needle 71 comes into contact with the surface of the workpiece 57. The carrier arm 33 then stops, but the control arm 81 continues to rise slightly until the contactors 89 and 91 are opened. This breaks the energizing circuit for the relay 136 causing contacts 136′ to open. Prior to this, the contacts 124′ of timing cam 124 were opened, so the opening of contacts 136′ breaks the energizing circuit for the drive motor 93 causing the motor and the cam 94 to stop. The cam 94 is then in the position illustrated in FIG. 7.

It may be noted that this position of the cam 94 with respect to its initial position provides an indication of the height of the workpiece. Thus, it is possible to calibrate the cam 94 such that when the needle 71 contacts the workpiece 57 and the cam 94 then stops, the height of the workpiece can be read directly. A suitable scale can be provided directly on the cam, or a separate scale can be provided with a marker connected to the cam. Thus, the machine can be used wherever accurate height measurements are desired.

Immediately after the cam 94 stops, the contacts 125′ associated with the timing cam 125 open so that when the contactors 89 and 91 are re-engaged later in the cycle, the cam drive motor 93 will not be energized. Next, the contacts 128′ associated with the timing cam 128 are closed, and this completes an energizing circuit for the electromagnet 97. Energization of the electromagnet 97 pulls the armature 99 toward the stop 107, and this causes the control arm 81 to pivot downwardly a predetermined distance and raise the arm 33 together with the etching head 32 one ten-thousandths of an inch away from the surface to be etched.

The closing of contacts 128′ also actuates the etchant valve 132 causing the electrolyte and gas to flow through the etching needle 71 onto the workpiece 57. Immediately thereafter, the contacts 127′ associated with the timing cam 127 are closed, and negative direct current potential is applied to the etching head 32 through the contactor 89. The etchant fluid and current remain on until the timing cams 127 and 128 open the associated contacts which may be about 4 or 5 seconds. The moat has now been etched. Next, the contacts 129′ associated with the timing cam 129 are closed, and this actuates the distilled water valve 133 so that washing water is directed onto the workpiece 57 through the pipe 48 illustrated in FIG. 1.

Contacts 129′ also actuate the lifting mechanism 115 causing the electromagnet 116 to pull in the armature 117 which pushes the actuator 118 against the bell crank 112. The crank pivots clockwise, and this lifts the etching head 32 away from the etched surface so that the initial rotation of the cam 94 when it resumes its movement will not cause the etching head to recontact the etched surface. Then the cams 124 and 125 will reclose the associated contacts 124' and 125' re-energizing the drive motor 93. The cam 94 rotates until it is near its original position where it engages the crank 112, and the bell crank 112 then pivots clockwise and opens the switch 121 de-energizing the drive motor 93 to stop the cam 94 in its original position. The timing motor 131 stops when contacts 126' associated with the timing cam 126 are opened. This completes the etching cycle.

*Horizontal Positioning of the Etching Head*

FIGS. 10, 11 and 12 show the micromanipulator structure of the aforementioned copending application Serial No. 794,391, filed February 19, 1959, which provides horizontal placement of the etching head. Several portions of the machine are omitted in these views in order to clarify the description of the basic construction. The positioning plate 29 is pivotal horizontally around the post 151, and the plate 29 is also movable radially with respect to the post 151. Although the movement of plate 29 is slightly arcuate, it is so slight as to be nearly linear when the lever system 35 is moved linearly. The plate 29 has a U-shaped opening 150 through which post 151 extends, and this opening allows freedom for both the pivotal and radial movement of the plate. Enlarged openings are also provided in the plate 29 at those places where the posts 31 extend through the plate. A three point ball bearing support 152 is provided between the stationary plate 30 and the movable plate 29.

The horizontal movement of the positioning plate 29 is controlled by the pantograph lever system 35. The system 35 includes four arms designated 153, 154, 155 and 156. In FIG. 11 it may be seen that the arm 154 is connected to a vertical sleeve 157, and the cam 158 is attached to the upper end of the sleeve. Forward and backward movement of the lever arm 153 will be applied through pantograph arm 154 to the sleeve 157 which will rotate the cam 158 and cause forward and backward movement of the plate 29. Pantograph arm 156 is connected to a vertical post 159 inside and coaxial with the sleeve 157, and another cam 160 is connected to the top of this post. Arms 155 and 156 transmit sidewise movement of the lever arm 153 to the post 159, and the post rotates the cam 160 to move the plate 29 sidewise. Thus, the cams 158 and 160 are on coaxial spindles which are independently rotatable by the associated pantograph arms. The cams and spindles convert the planar movement of the pantograph lever system 35 into corresponding planar movement of the positioning plate 29. The movement of the plate 29 is small because of the reduction provided by the pantograph and cam arrangement, and this provides extreme accuracy of control with relatively large hand movements.

The shape of the cams 158 and 160 is best illustrated in FIG. 12. The cams 158 and 160 respectively engage two blocks 161 and 162 which are positioned at a 90° angle relative to the center of the cam. These blocks are mounted on the underside of the positioning plate 29 and are urged against the cams 158 and 160 by a spring 163 (see FIG. 12) which runs diagonally from the base plate 21 to the positioning plate 29. Cam 158 has a shape providing forward and backward radial movement of the plate 29, and cam 160 has a shape providing left and right pivotal movement of the plate. The lever system 35 has a reverse relationship with cams 158 and 160 such that a hand movement to the right, for example, will move the plate 29 to the left, and movement of the lever system to the rear, for example, will move the plate forward. The reason for this reverse relationship is that movement of the microscope in the direction opposite to the lever movements will make it appear to the operator that the workpiece is moving in the same direction as the operator is moving his hand, and this makes it easier for the operator to control the micro-manipulator.

From the foregoing description it is evident that the method and apparatus of the invention affords accurate positioning of a tool relative to a workpiece. In the illustrated etching machine, the etching head is aimed by simple manual actuation and is lowered and spaced over the workpiece entirely automatically. The apparatus includes a mechanism which automatically measures the height of the workpiece, and no hand measurements with micrometers are required. The transistors which are processed by the etching machine have improved uniformity and reduced contamination, and the machine produces a high yield of commercially satisfactory units.

I claim:

1. Apparatus for use in etching an area of predetermined shape on a surface of a workpiece which is supported in a work position at the apparatus during the etching, including in combination, frame means, an elongated pivotal structure supported by said frame means at least partly over the work position for the workpiece, an etching head supported by said pivotal structure and having an initial position spaced above said work position, said etching head being engageable with the workpiece when provided at the work position upon pivotal movement of said structure in a first direction, driving means coupled to said structure for pivoting the same, said driving means including power means and a rotary cam driven by said power means and having a reference position corresponding to the initial position of said pivotal structure, said cam being rotatable away from said reference position by said power means upon actuation thereof, means for stopping said cam at a second position when said etching head contacts the workpiece, with the rotation of said cam from said reference position to said second position corresponding to the distance between the workpiece and the normal position of said etching head, whereby the second position of said cam relative to said reference position thereof provides a measurement of the height of the workpiece, spacing means coupled to said pivotal structure and operable to move said structure a preadjusted distance in the reverse of said first direction, and means for actuating said spacing means upon engagement between said etching head and the workpiece to move said head to an etching position spaced a predetermined distance away from the surface of the workpiece to be etched.

2. Apparatus for use in etching an area of predetermined shape on a surface of a workpiece which is supported in a work position at said apparatus during the etching, including in combination, frame means, an elongated pivotal structure supported by said frame means at least partly over the work position of the workpiece, an etching head supported by said pivotal structure and having an initial position spaced above said work position, said etching head being engageable with the workpiece when provided at the work position upon pivotal movement of said structure in a first direction, driving means including a rotary cam and a motor coupled to said cam for rotating the same, means coupling said cam to said structure for pivoting said structure upon rotation of said cam, first switching means coupled to said motor for actuating said motor to rotate said cam, second switching means coupled to said motor and operable automatically when said etching head contacts a workpiece at the work position for stopping said motor and said cam, said coupling means for said cam including a movable member engaged by said cam during the aforesaid rotation thereof, and electrical means coupled to said movable member for moving the same to a predetermined position upon engagement between said etching head and said workpiece, said coupling means being adapted to move said pivotal structure in the reverse of said first direction upon the aforesaid movement of said movable member to position said etching head a predetermined distance away from the surface of the workpiece to be etched.

3. Apparatus for use in etching an area of predetermined shape on a surface of a workpiece, including in combination, means for supporting the workpiece in a work position at the apparatus, an etching head, frame means for supporting said etching head above the work position of the workpiece, a carrier arm movably connected to said frame means for raising said etching head to a rest position and for lowering said etching head into contact with the surface of the workpiece when provided at the work position, a control arm movably connected to said frame means and engageable with said carrier arm for controlling the movement of said carrier arm, a driving mechanism including a motor for moving said carrier arm and said control arm in one direction to bring said etching head into contact with said workpiece when at the work position, switching means adapted to be actuated by said control arm after said etching head contacts said workpiece to stop the motor and thereby stop the movement of the carrier arm and the control arm, and control means associated with said control arm and said carrier arm for moving said arms in the reverse of said one direction a distance sufficient to move said etching head away from said workpiece a predetermined microdimensional distance, such that application of etchant to the workpiece from said etching head will produce an etched area of predetermined shape.

4. Apparatus for use in etching an area of predetermined shape on a semiconductor body, including in combination, means for supporting the semiconductor body in a work position to be etched, an etching head, frame means for supporting said etching head near the work position for the semiconductor body, a carrier movably connected to said frame means and having said etching head connected thereto, a control member movably connected to said frame means and engageable with said carrier to control the aforesaid movement thereof, said carrier and said control member being movable in a first direction to carry said etching head toward the work position for said semiconductor body and being movable in a second direction to carry said etching head away from the work position for said semiconductor body, driving means including a motor coupled to said carrier and to said control member, said driving means being operable automatically to move said carrier and said control member in said first direction for bringing said etching head into contact with the surface of the semiconductor body which is to be etched, said control member being engaged with said carrier during the aforesaid movement thereof in said first direction, and said control member being disengaged from said carrier and movable with respect to said carrier in said first direction by said driving means after said etching head contacts said semiconductor body, switching means coupled to said motor and operable by said control member upon the aforesaid movement thereof with respect to said carrier to stop said motor, and a spacing mechanism connected to said control member for causing movement of said control member in said second direction to engage said carrier and move the same in said second direction a distance sufficient to carry said etching head away from said semiconductor body a predetermined distance, such that application of etchant to said semiconductor body from said etching head will produce an etched area of predetermined shape on said body.

5. Apparatus for use in etching an area of predetermined shape on a surface of a workpiece, including in combination, an etching head, a frame for supporting said etching head, movable means connected to said frame and to said etching head for moving said etching head toward and away from a work position for the workpiece at the apparatus, first control means coupled to said movable means and operable automatically to actuate said movable means for moving said etching head into contact with the surface of the workpiece when the same is mounted in the work position to be etched, and second control means coupled to said movable means and operable automatically to actuate said movable means for moving said etching head away from the work position for said workpiece a predetermined microdimensional distance, such that application of etchant to said workpiece from said etching head in the final position thereof will produce an etched area of a predetermined shape.

6. A machine for automatically positioning an etching head a predetermined distance away from a surface of a workpiece which is to be etched, so that application of etching fluid to the surface from the etching head will form an etched area of desired configuration, said machine including in combination, frame means for supporting the etching head, an elongated carrier arm having a pivot portion and having a mounting portion spaced from said pivot portion for securing the etching head in position for movement toward and away from a work position for the workpiece, an elongated control arm having a pivot portion and having coupling means spaced from said pivot portion, pivot means connecting said pivot portions of said carrier arm and said control arm to said frame so that said arms have independent pivotal movement about said pivot means, said arms respectively having contactor portions which are mutually engageable for coupling said arms together to move said etching head toward said work position, said contactor portions being disengageable to permit independent movement of said arms, driving means coupled to said control arm by said coupling means for actuating said control arm, said driving means including a motor and a rotary cam driven by said motor, said arms being movable in a first direction by said driving means upon rotation of said cam to bring said etching head into contact with said workpiece when provided at the work position, and said control arm being independently movable further in said first direction after said etching head contacts said workpiece, switching means coupled to said motor and operable by said control arm upon such further movement thereof to stop said motor, said coupling means of said control arm including a spacing member engageable by said rotary cam and movable between first and second positions to move said control arm, means normally establishing said spacing member in said first position, and electrical means coupled to said spacing member for moving said spacing member to said second position after said control arm has operated said switching means to stop said motor, with the movement of said spacing member being adjusted to move said control arm together with said carrier arm in the reverse of said first direction a distance sufficient to position the etching head the predetermined distance away from the surface of the workpiece which is to be etched.

7. Apparatus for use in etching an area of predetermined shape on a surface of a workpiece which is supported in a work position at said apparatus during the etching, said apparatus including in combination, frame means, an elongated pivotal structure supported by said frame means at least partly over the work position, an etching head supported by said pivotal structure and having a normal position spaced above said work position, means for supplying etchant to said etching head, said etching head being engageable with the workpiece when provided at said work position upon pivotal movement of said structure in a first direction, driving means including a rotary cam and a motor coupled to said cam for rotating the same, said cam having an initial position corresponding to said initial position of said etching head, means coupling said cam to said structure for pivoting the same upon rotation of said cam, an energizing circuit for said motor, first switching means connected to said energizing circuit for actuating said motor to start rotation of said cam, means coupling said cam to said first switching means for controlling the operation of said first switching means, second switching means connected to said energizing circuit and operated by said pivotal structure when said etching head contacts the workpiece when provided at the work position for stopping said motor and said cam, said coupling means for said cam including a movable spacing member engaged by said cam during the aforesaid rotation thereof and normally in a first position, an electromagnet having an energizing circuit and associated with said spacing member for moving said spacing member to a second position, said coupling means being operative to move said pivotal structure in the reverse of said first direction upon the aforesaid movement of said spacing member to position said etching head a predetermined distance away from the surface of the workpiece to be etched, and electrical timer means including first cam switch means connected to said energizing circuit for said motor and operative to open said energizing circuit at a predetermined time after said second switching means has stopped the motor as aforesaid, second cam switch means connected to said energizing circuit for said electromagnet and operative to complete said energizing circuit to actuate said electromagnet after said motor has stopped, thereby spacing said etching head as aforesaid, and third cam switch means for starting and stopping the flow of etchant to said etching head after said head is spaced from said workpiece as aforesaid, said first cam switch means being operative to close said energizing circuit for said motor after the etching is complete to return said cam to its initial position, and said first switching means being operated by said cam when said cam has reached its initial position to stop said motor.

8. Apparatus for measuring the height of a workpiece when such workpiece is supported in a work position at the apparatus, including in combination, frame means, an elongated pivotal structure supported by said frame means at least partly over the work position, said structure including a portion having a normal position spaced above said work position, and said portion being engageable with the workpiece when provided at said work position upon pivotal movement of said structure in a first direction, driving means coupled to said structure for pivoting the same, said driving means including a rotary cam having a reference position corresponding to the normal position of said pivotal structure, means for rotating said cam upon actuation of said driving means and stopping the same at a second position when said structure contacts the workpiece, with the rotation of said cam from said reference position to said second position corresponding to the distance between the normal position of said structure and the workpiece, whereby the second position of said cam relative to said reference position thereof provides a measurement of the height of the workpiece.

9. A machine for automatically measuring the height of a workpiece, including in combination, means for mounting the workpiece and establishing a reference for the measurement of height, a frame located adjacent said mounting means for the workpiece, elongated arm means having means pivotally connecting said arm means to said frame and having a portion for engaging the workpiece, driving means coupled to said arm means for pivoting said arm means to move said portion thereof into contact with a workpiece when mounted on said mounting means, said driving means including a motor and a rotary cam driven by said motor, first switching means coupled to said motor and operable by said arm means when said arm means contacts said workpiece to stop said motor and said cam, with the position of the cam when it is stopped as aforesaid providing a measurement of the height of the workpiece, timing means coupled to said motor for starting the same to continue rotation of said cam, and second switching means coupled to said motor and adapted to be actuated by said cam when it reaches a predetermined starting position to stop said motor and said cam.

10. Apparatus for use in jet etching an area of predetermined shape on an etchable workpiece which is so small as to require precise positioning of an etching head relative to the workpiece while allowing for tolerance variations in the dimensions of the workpiece, said apparatus including in combination, an etching head of the jet type, frame means for supporting said etching head, movable means pivotally connected to said frame means and connected to said etching head so as to provide movement of said etching head toward and away from a work position for the workpiece, driving means operatively connected to said movable means for pivoting the same to move said etching head toward said work position, said driving means including a motor and a rotary cam driven by said motor, switching means coupled to said motor and operable to de-energize said motor with said etching head in contact with a workpiece when provided at said work position in the operation of said apparatus, and spacer means including a movable member coupled to said movable means and engageable by said rotary cam and electromagnetic means for moving said movable member a preadjusted distance so as to back said etching head away from said work position for said workpiece a distance such that application of etchant to a workpiece when provided at said work position will produce an etched area of predetermined configuration.

References Cited in the file of this patent

UNITED STATES PATENTS

| | | |
|---|---|---|
| 2,617,762 | Basilewsky | Nov. 11, 1952 |
| 2,684,939 | Geese | July 27, 1954 |
| 2,698,832 | Swanson | Jan. 4, 1955 |
| 2,746,917 | Comstock | May 22, 1956 |
| 2,797,193 | Eigler et al. | June 25, 1957 |
| 2,827,427 | Barry et al. | Mar. 18, 1958 |
| 2,844,531 | Prince | July 22, 1958 |
| 2,850,444 | Armstrong et al. | Sept. 2, 1958 |
| 2,979,444 | Tiley | Apr. 11, 1961 |